(12) United States Patent
Malta et al.

(10) Patent No.: US 7,147,715 B2
(45) Date of Patent: Dec. 12, 2006

(54) GROWTH OF ULTRA-HIGH PURITY SILICON CARBIDE CRYSTALS IN AN AMBIENT CONTAINING HYDROGEN

(75) Inventors: David Phillip Malta, Raleigh, NC (US); Jason Ronald Jenny, Raleigh, NC (US); Hudson McDonald Hobgood, Pittsboro, NC (US); Valeri F. Tsvetkov, Durham, NC (US)

(73) Assignee: Cree, Inc., Durham, NC (US)

( * ) Notice: Subject to any disclaimer, the term of this patent is extended or adjusted under 35 U.S.C. 154(b) by 340 days.

(21) Appl. No.: 10/628,189

(22) Filed: Jul. 28, 2003

(65) Prior Publication Data

(51) Int. Cl.
*C30B 25/12* (2006.01)
*C30B 25/14* (2006.01)

(52) U.S. Cl. .......................... 117/109; 117/89; 117/93; 117/105

(58) Field of Classification Search .................. 117/84, 117/89, 109, 93, 105
See application file for complete search history.

(56) References Cited

U.S. PATENT DOCUMENTS

| | | |
|---|---|---|
| 2,854,364 A | 9/1958 | Lely |
| 5,119,540 A | 6/1992 | Kong et al. |
| 5,151,384 A | 9/1992 | Williams |
| 5,611,955 A | 3/1997 | Barrett et al. |
| 5,709,745 A | 1/1998 | Larkin et al. |
| 5,718,760 A | 2/1998 | Carter et al. |
| 6,113,451 A | 9/2000 | Hobart et al. |
| 6,200,917 B1 | 3/2001 | Carter et al. |
| 6,201,342 B1 | 3/2001 | Hobart et al. |
| 6,218,680 B1 | 4/2001 | Carter, Jr. et al. |

FOREIGN PATENT DOCUMENTS

| | | |
|---|---|---|
| EP | 0 561 462 A2 | 9/1993 |
| JP | 8208380 A | 8/1996 |

OTHER PUBLICATIONS

T. Furusho, S.K. Lilov, Ohshima, S. Nishino;Crystal growth of silicon carbide In hydrogen atmosphere by sublimation close space technique;Journal of Crystal Growth 237-239 (2002) 1235-1238 Elsevier Science B.V. Japan.
I.G.Ivanov, C Hallin, A. Henry, O.Kordina, E.Janzen; Nitrogen doping concentration as determined by photoluminescence in 4H-and 6H-SiC; J. Appl. Phys. Sep. 15, 1996 3504-3508 American Institute of Physics.

*Primary Examiner*—Felisa Hiteshew
(74) *Attorney, Agent, or Firm*—Summa, Allan & Additon, P.A.

(57) ABSTRACT

A method is disclosed for producing semi-insulating silicon carbide crystal with a controlled nitrogen content. The method includes the steps of introducing an ambient gas containing hydrogen into a sublimation growth chamber, heating a silicon carbide source powder to sublimation in the hydrogen ambient growth chamber while, heating and then maintaining a silicon carbide seed crystal in the hydrogen ambient growth chamber to a second temperature below the temperature of the source powder, at which second temperature sublimed species from the source powder will condense upon the seed crystal, continuing to heat the silicon carbide source powder until a desired amount of silicon carbide crystal growth has occurred upon the seed crystal, while maintaining an ambient concentration of hydrogen in the growth chamber sufficient to minimize the amount of nitrogen incorporated into the growing silicon carbide crystal, and while maintaining the source powder and the seed crystal during sublimation growth at respective temperatures high enough to increase the number of point defects in the growing crystal to an amount that renders the resulting silicon carbide crystal semi-insulating.

42 Claims, 2 Drawing Sheets

GROWTH OF ULTRA-HIGH PURITY SILICON CARBIDE CRYSTALS IN AN AMBIENT CONTAINING HYDROGEN

STATEMENT OF GOVERNMENT INTEREST

The U.S. Government has a paid-up license in this invention and the right in limited circumstances to require the patent owner to license others on reasonable terms as provided for by the terms of Contract No. N00014-02-C-0306 awarded by Defense Advanced Research Projects Agency (DARPA).

BACKGROUND OF THE INVENTION

This application is related to copending application Ser. No. 10/628,188 filed concurrently herewith for, "Reducing Nitrogen Content in Silicon Carbide Crystals by Sublimation Growth in a Hydrogen Containing Ambient."

The present invention relates to the growth of ultra high purity semi-insulating silicon carbide crystals in a hydrogen ambient that yields a low nitrogen concentration in the crystal to enhance the semi-insulating qualities.

Silicon carbide (SiC) has a combination of electrical and physical properties that make it an attractive semiconductor material for high temperature, high voltage, high frequency and high power electronic devices. These properties include a 3.0 electron-volt (eV) bandgap (6H), a 4 Megavolt per centimeter (MV/cm) electric field breakdown, a 4.9 W/cmK thermal conductivity, and a $2 \times 10^7$ centimeter per second (cm/s) electron drift velocity. Silicon carbide is also particularly useful in its ability to be made conductive by doping or semi-insulating by various processing techniques. These qualities make silicon carbide a material of choice for a vast array of electronic applications.

The production of integrated circuits for many applications, such as RF devices, requires a semi-insulating substrate on which electronic devices can be built and connected to one another. Historically, sapphire was used as substrate material for microwave devices because of its high resistance to current flow. Sapphire has the disadvantage, however, of limiting the types of semiconductor layers that may be fabricated on the substrate with appropriate crystal lattice matching for proper device operation.

As recognized by those familiar with semiconductor electronics, certain devices often require high resistivity ("semi-insulating") substrates to reduce RF coupling or for other functional purposes such as device isolation because conductive substrates tend to cause significant problems at higher frequencies. As used herein, the terms "high resistivity" and "semi-insulating" can be considered synonymous for most purposes. In general, both terms describe a semiconductor material having a resistivity greater than about 1500 ohm-centimeters (ohm-cm).

In general, semi-insulating silicon carbide devices should have a substrate resistivity of at least 1500 ohm-centimeters (ohm-cm) in order to achieve RF passive behavior. Furthermore, resistivities of 5000 ohm-cm or better are needed to minimize device transmission line losses to an acceptable level of 0.1 dB/cm or less. For device isolation and to minimize back-gating effects, the resistivity of semi-insulating silicon carbide should approach a range of 50,000 ohm-cm or higher.

Research in the field shows that the semi-insulating behavior of a silicon carbide substrate is the result of energy levels deep within the band gap of the silicon carbide; i.e., farther from both the valence band and the conduction band than the energy levels created by p-type and n-type dopants. These "deep" energy levels are believed to consist of states lying at least 300 meV away from the conduction or valence band edges, e.g., U.S. Pat. No. 5,611,955 which is representative of standard prior research in this art.

Various devices fabricated in silicon carbide require different degrees of conductivity to provide accurate electrical responses, such as current switching, signal amplification, power transfer, etc. In fact, the desired electrical response of a silicon carbide crystal can range from a highly conductive crystal to a highly resistive (semi-insulating) crystal. Silicon carbide grown by most techniques is generally too conductive for semi-insulating purposes, however. In particular, the nominal or unintentional nitrogen concentration in silicon carbide tends to be high enough in sublimation grown crystals ($\geq 1-2 \times 10^{17}/cm^3$) to provide sufficient conductivity to prevent silicon carbide from being used in devices that require a semi-insulating substrate, such as microwave devices.

A recurring issue in fabricating silicon carbide crystals for electronic devices, therefore, is the control of elemental impurities such as nitrogen within the crystal. Nitrogen content, for example, affects the color of a silicon carbide crystal. This color change can have deleterious consequences for the usefulness of a crystal in certain applications requiring luminescence, such as light emitting diodes and gemstone fabrication. The nitrogen in a crystal may also yield electrical conductivity that must be controlled for silicon carbide to have appropriate properties in diverse electronic applications. The invention herein includes a means for achieving a semi-insulating silicon carbide crystal one step of which comprises reducing the nitrogen content, and therefore the inherent conductivity of a crystal with an improved method of sublimation growth in a hydrogen ambient atmosphere.

Researchers, therefore, persistently struggle with the issue of controlling, and particularly reducing, the amount of nitrogen that is transferred from the atmosphere of a sublimation growth chamber into a growing silicon carbide crystal. Commonly assigned U.S. Pat. No. 5,718,760 to Carter et al., for example, discloses a method of reducing the nitrogen concentration in the ambient atmosphere of a silicon carbide sublimation system. The Carter '760 patent reduces the nitrogen by back filling the growth chamber with an inert gas such as argon and then evacuating the growth chamber to a very low pressure.

Another technique for decreasing the ambient nitrogen in a crystal growth system is the minimization of nitrogen content in the equipment itself. Commonly assigned U.S. Pat. No. 5,119,540 issued to Kong et al., discloses that most, if not all, of the undesired nitrogen in a crystal growth system is a result of nitrogen gas that escapes from the equipment itself. For example, nitrogen trapped in graphite equipment may leak into the ambient atmosphere because the equipment cracks or develops pin holes through which nitrogen escapes at very high temperatures. The Kong '540 patent prevents incorporation of nitrogen into subject silicon carbide crystals by utilizing fabrication equipment made of materials with low nitrogen concentration. The Kong '540 patent, therefore, teaches that extremely pure equipment components that are free of high nitrogen content result in silicon carbide crystals that are less contaminated with undesirable levels of nitrogen. Kong '540 shows nitrogen minimization in a chemical vapor deposition system but is equally pertinent in the sublimation systems discussed herein.

In addition to reducing the concentration of nitrogen, researchers also reduce the effects of unavoidable nitrogen content within a silicon carbide crystal. For example, the Carter '760 patent acknowledges that the background nitrogen in the sublimation chamber can lead to undesirable crystal color. The '760 patent, therefore, discloses a method of compensating the nitrogen content with a corresponding p-type dopant to minimize or eliminate the undesirable effects of the nitrogen. The p-type dopant and the nitrogen compensate one another and prevent undesirable color centers in the preferably colorless silicon carbide crystal of the Carter '760 invention.

The nitrogen compensation technique has also been used to prevent unintentional nitrogen doping from dominating the conductivity of silicon carbide crystals. Commonly assigned U.S. Pat. No. 6,218,680, also issued to Carter et al., discloses a further method of compensating the nitrogen content of a silicon carbide crystal grown by sublimation. Carter points out that boron may be used to compensate the inherent nitrogen. Carter '680 also utilizes the temperature gradient in the disclosed sublimation process to create point defects in a silicon carbide crystal. The Carter '680 technique pairs an undesirable nitrogen concentration in the silicon carbide crystal with a corresponding acceptor dopant, such as boron. Carter '680 then pairs any excess dopants with temperature induced point defects to yield a desired semi-insulating crystal.

Other research also concedes that unintentional nitrogen incorporation occurs in silicon carbide crystals grown by sublimation. This research tends to focus on means for minimizing the effects of the undesirable nitrogen concentration instead of preventing the nitrogen incorporation from the outset. U.S. Pat. No. 5,611,955, issued to Barrett et al. is illustrative of this point. Barrett '955 shows a means of introducing elements such as vanadium into the semiconductor material that create deep energy states within the forbidden energy gap. The Barrett '955 method accounts for nitrogen content in a silicon carbide crystal by trapping the nitrogen and hindering electron mobility from the nitrogen. Barrett, therefore, achieves a semi-insulating silicon carbide substrate by adjusting the effects of the nitrogen instead of preventing its presence in the crystal.

The techniques set forth in the two Carter patents, which have a common assignee as the invention described and claimed herein, are useful for their respective purposes to minimize the effects of nitrogen incorporation in a silicon carbide crystal. The Barrett '955 patent requires further elemental doping and can give rise to unpredictable electrical responses in a subject silicon carbide crystal.

A need continues to exist, therefore, for a method of gaining extensive control over the incorporation of nitrogen into a silicon carbide crystal at the point of initial sublimation. By controlling the nitrogen content from the initial growth of the crystal, compensation techniques and the associated process steps may be minimized. Controlling the nitrogen incorporation also allows development of more diverse types of crystals, including crystals with varying degrees of nitrogen content for specialized purposes.

The method described and claimed herein provides a technique for fabricating semi-insulating silicon carbide crystals with a more predictable resistivity than methods of the prior art. Gaining control over the amount of nitrogen incorporated into a silicon carbide crystal grown by sublimation is a critical improvement in sublimation processes and yields a more reliable, higher quality semi-insulating silicon carbide crystal product.

SUMMARY OF THE INVENTION

The inventors herein have developed a method of producing ultra high purity semi-insulating silicon carbide crystals in a hydrogen or hydrogen-containing ambient that yields a low nitrogen concentration in the crystal to enhance the semi-insulating qualities. As noted above, standard sublimation growth of silicon carbide often takes place in an argon ambient atmosphere. One of the improvements to sublimation growth of silicon carbide described herein is the replacement of the argon ambient with a hydrogen ambient in the growth chamber. The hydrogen ambient allows control and selective tuning of the nitrogen content of the growing crystal.

The nitrogen content of a silicon carbide crystal is an instrumental factor in establishing crystal conductivity or resistivity. The method described and claimed herein, therefore, provides a technique for reducing the nitrogen content that is transferred from the ambient atmosphere of a sublimation growth chamber to a silicon carbide crystal grown therein. The reduced nitrogen content in the growing crystal provides a more reliable semi-insulating quality to the resulting silicon carbide product.

DETAILED DESCRIPTION

The invention herein is a method of reducing the nitrogen content of a semi-insulating silicon carbide crystal grown by sublimation and a resulting high purity semi-insulating silicon carbide crystal with a reduced nitrogen concentration therein. A first embodiment of the invention introduces a hydrogen or hydrogen-containing ambient atmosphere into a sublimation growth chamber used to grow silicon carbide crystals. Previously standard sublimation systems utilize an argon ambient in the growth of silicon carbide. The inventors herein have discovered that a hydrogen ambient is more useful than other ambient gases to control the nitrogen content of the growing crystal.

The method of the invention herein includes introducing a silicon carbide source powder and a silicon carbide seed crystal into a sublimation growth chamber. The source powder, as its name implies, provides a source of silicon carbide species in the growth chamber for growing a silicon carbide crystal on a growth surface provided by the silicon carbide seed crystal. U.S. Pat. No. Re. 34,861, the entire contents of which are incorporated by reference herein, sets forth that solid silicon carbide in powdered form is one such preferred source material. The method of the first embodiment includes heating the silicon carbide source powder to sublimation in a hydrogen ambient growth chamber. The hydrogen ambient of the sublimation growth chamber is established by introducing hydrogen gas into the growth chamber at a pressure of between about 0.1 and 50 Torr and at a flow rate of between about 10 and 1000 standard cubic centimeters per minute (sccm).

The sublimation process requires temperature control of different regions within the growth chamber. While heating the silicon carbide source powder to a first temperature, the silicon carbide seed crystal is heated and maintained at a second temperature approaching the temperature of the source powder. The temperature of the seed crystal is, therefore, lower than the temperature of the source powder and lower than that temperature at which silicon carbide will sublime. The reduced seed crystal temperature encourages sublimed species from the source powder to condense upon the seed crystal. The seed crystal, therefore, provides the growth surface for fabricating a silicon carbide crystal with desired dimensions. The method herein includes a continued heating of the silicon carbide source powder until a desired amount of silicon carbide crystal growth has occurred upon the seed crystal.

The seed crystal preferably has a polytype selected from among the 3C, 4H, 6H and 15R polytypes of silicon carbide, depending on the polytype desired in the resulting grown crystal. The silicon carbide species that condense onto the seed crystal optimally grow a silicon carbide crystal with the same polytype as the seed crystal.

The invention maintains a thermal gradient between the growth surface of the seed crystal and the source powder. Re. 34,861 describes various means for maintaining a thermal gradient between the source powder and the seed crystal. The gradient may be accomplished, for example, by establishing a desired geometric distance and temperature difference between the seed crystal and the source powder. Otherwise, the temperature gradient may be established by independently controlling the temperatures of the respective regions within the growth chamber in which the silicon carbide powder sublimes and the silicon carbide crystal grows.

Typically, the silicon carbide source powder is maintained at a temperature of between about 2000° C. and 2500° C. The seed crystal, in turn, is maintained at a temperature of between about 50° C. and 350° C. lower than the temperature of the source powder.

The method herein further includes maintaining the source powder and the seed crystal during sublimation growth at respective temperatures high enough to increase the number of point defects in the growing crystal. The point defects, in conjunction with lower nitrogen content, render the resulting silicon carbide crystal semi-insulating.

Alternatively, the step of increasing the number of point defects can comprise the method described in co-pending and commonly-assigned U.S. application Ser. No. 10/064,232, filed Jun. 24, 2002 for, "Method For Producing Semi-Insulating Resistivity In High Purity Silicon Carbide Crystals," the contents of which are incorporated entirely herein by reference. As set forth therein, the method comprises heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration (i.e., number per unit volume) of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

The method described and claimed herein allows the production of semi-insulating silicon carbide crystals without the need for deep level doping elements, such as vanadium. As discussed in commonly assigned U.S. Pat. No. 6,218,680, prior art methods of fabricating semi-insulating silicon carbide incorporate dopants that form energy states at levels between the valence and conduction bands of silicon carbide. These energy states of the prior art are far removed from both the conduction band and the valence band to enhance the semi-insulating qualities of the crystal. Common deep level trapping elements incorporated into silicon carbide include vanadium and other transition metals. The method herein allows the fabrication of semi-insulating silicon carbide crystals without relying upon more complicated doping levels that may be quite difficult to accurately control.

The method developed by the inventors herein allows for deep level trapping elements in the silicon carbide source powder to be kept to minimum levels, thereby simplifying the fabrication process. The deep level trapping elements in the silicon carbide source powder are referred to herein as being present in amounts that are "below detectable levels," meaning that the elements are present in amounts that cannot be detected by modem sophisticated analytical techniques.

In particular, because one of the more common techniques for detecting elements in small amounts is secondary ion mass spectroscopy ("SIMS"), the detectable limits referred to herein are those amounts of elements such as vanadium and other transition metals that are present in amounts less than $1\times10^{16}$ (1E16), or in other cases (including vanadium), less than 1E14. These two amounts represent typical detection limits for most trace elements (particularly vanadium) using SIMS techniques; e.g., SIMS Theory—Sensitivity and Detection Limits, Charles Evans & Associates (1995), www.cea.com.

The method described and claimed herein helps control the amount of nitrogen incorporated into the growing silicon carbide crystal by controlling the hydrogen concentration in the ambient atmosphere of the growth chamber. Although the inventors do not wish to be bound by any particular theory, the effectiveness of the hydrogen on suppressing the nitrogen in the crystal is attributed to the passivation of the silicon carbide growth surface by hydrogen atoms. The hydrogen atoms, in effect, block, reduce, or otherwise hinder the incorporation of nitrogen atoms at the surface of the growing crystal.

The method of the invention herein, therefore, is appropriately described in another embodiment as a method of passivating a growing silicon carbide crystal in a sublimation growth chamber to control the nitrogen that can be incorporated into the crystal. A second embodiment of the invented method includes introducing an ambient gas containing hydrogen into the growth chamber and heating a silicon carbide source powder to sublimation in the hydrogen ambient growth chamber. The source powder is heated while simultaneously heating and maintaining a silicon carbide seed crystal in the hydrogen ambient growth chamber to a second temperature below the temperature of the source powder. The temperature of the seed crystal is low enough for sublimed species from the source powder to condense upon the seed crystal.

The hydrogen passivation method, furthermore, maintains the source powder and the seed crystal during sublimation growth at respective temperatures high enough to increase the number of point defects in the growing crystal. The point defects assist in rendering the resulting silicon carbide crystal semi-insulating. The heating, sublimation, and condensation steps continue at sufficiently high temperatures to induce a sufficient number of point defects for a semi-insulating crystal. The overall silicon carbide deposition continues until a desired amount of highly pure semi-insulating silicon carbide crystal grows upon the seed crystal.

An ambient concentration of hydrogen is maintained in the growth chamber sufficient to passivate the growing silicon carbide crystal against the incorporation of nitrogen. The hydrogen passivation thereby controls the amount of nitrogen incorporated into the growing silicon carbide crystal. The inventors do not wish to be bound by any particular theory, but research in the field of sublimation grown silicon carbide crystals suggests that the hydrogen atoms in the ambient atmosphere of the growth chamber reduce the number of unpaired electrons in the silicon carbide crystal. U.S. Pat. No. 5,151,384, issued to Williams and incorporated by reference herein, describes and claims the electron pairing of hydrogen passivation on silicon compounds at column 2, lines 38–70.This reduction of unpaired electrons corresponds to a reduced number of nitrogen atoms likely to bond with the silicon carbide crystal as it grows.

Alternative explanations also exist to explain the physical mechanism by which the hydrogen ambient suppresses nitrogen incorporation. One explanation is that the hydrogen passivation of the silicon carbide crystal is essentially a layer of hydrogen atoms on the crystal growth surface that protects the surface from nitrogen incorporation. See, e.g. U.S. Pat. No. 5,709,745 (col. 26, lines 18–24); U.S. Pat. No. 6,113,451 (col. 8, lines 38–44); and U.S. Pat. No. 6,201,342 (col. 8, lines 33–39), all of which are incorporated entirely by reference herein.

Finally, published European Patent Application 0561462A2 (col. 10, lines 42–48) filed on Mar. 12, 1993 describes hydrogen passivation as filling in spaces between the silicon carbide crystal grain boundaries and disallowing nitrogen incorporation therein. The inventors do not rely on any particular one of these descriptions of the effects of hydrogen in silicon carbide growth. The method disclosed and claimed herein successfully controls nitrogen content by a combination of these physical and chemical interactions between the hydrogen atoms and the growing silicon carbide crystal. The method results in a desirable highly pure, semi-insulating silicon carbide crystal growth.

Controlling the hydrogen flow rate into the growth chamber between about 80 and 1000 standard cubic centimeters per minute (sccm) at a pressure of between about 0.1 and 50 Torr provides a sufficient hydrogen concentration in the growth chamber to yield the desired crystal. The method has proven successful in fabricating a silicon carbide crystal with less than about $2 \times 10^{15}$ nitrogen atoms per cubic centimeter ($cm^{-3}$). In preferred practice, the hydrogen concentration in the ambient atmosphere yields a silicon carbide crystal with less than about $1 \times 10^{15}$ $cm^{-3}$ nitrogen atoms. The low nitrogen concentration of the resulting silicon carbide crystals, coupled with the deep levels, yields a resistivity greater than or equal to $1 \times 10^5$ ohm-cm.

The invention claimed herein is useful in a variety of other applications. For example, synthesizing high purity silicon carbide powder in a hydrogen containing environment potentially reduces nitrogen content in the source powder. The technique is also useful in the manufacture of near colorless gemstone material. Finally, the control of nitrogen incorporation in a silicon carbide crystal represents an advancement in the manufacture of semi-insulating crystals and wafers of silicon carbide used in the manufacture of MESFET and HEMT high frequency electronic devices. The technique disclosed herein provides an efficient and straight forward method of achieving extremely low nitrogen levels in silicon carbide crystals and wafers. In fact, bulk wafers having extremely low concentrations of nitrogen may be produced by controlling the nitrogen content of a growing crystal. Wafers made from these crystals may displace the need for the thick high purity epitaxial layers grown on current silicon carbide substrates.

Figure 1:
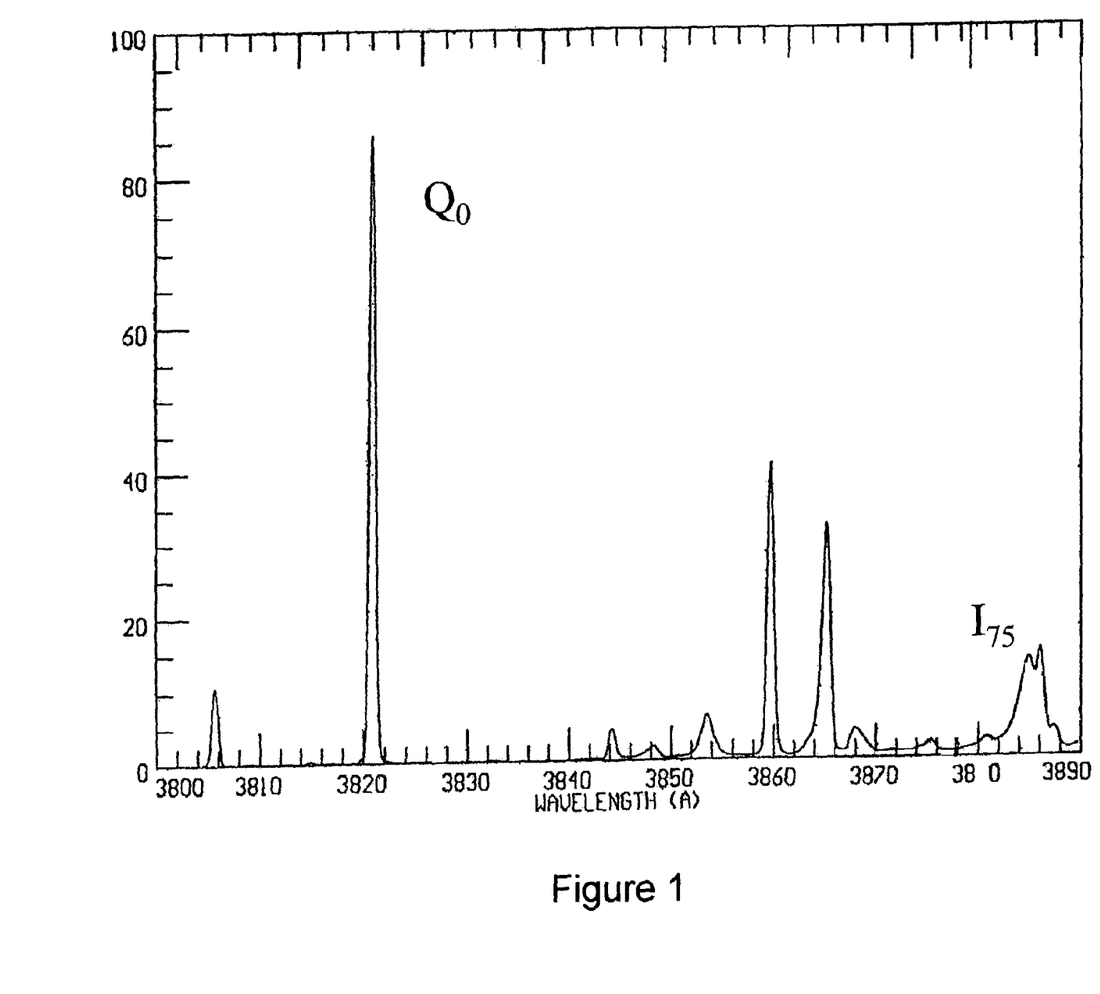
FIG. 1 shows the low temperature photoluminescence spectrum corresponding to a 4H-silicon carbide crystal grown in a conventional argon ambient of the prior art.
Figure 2:
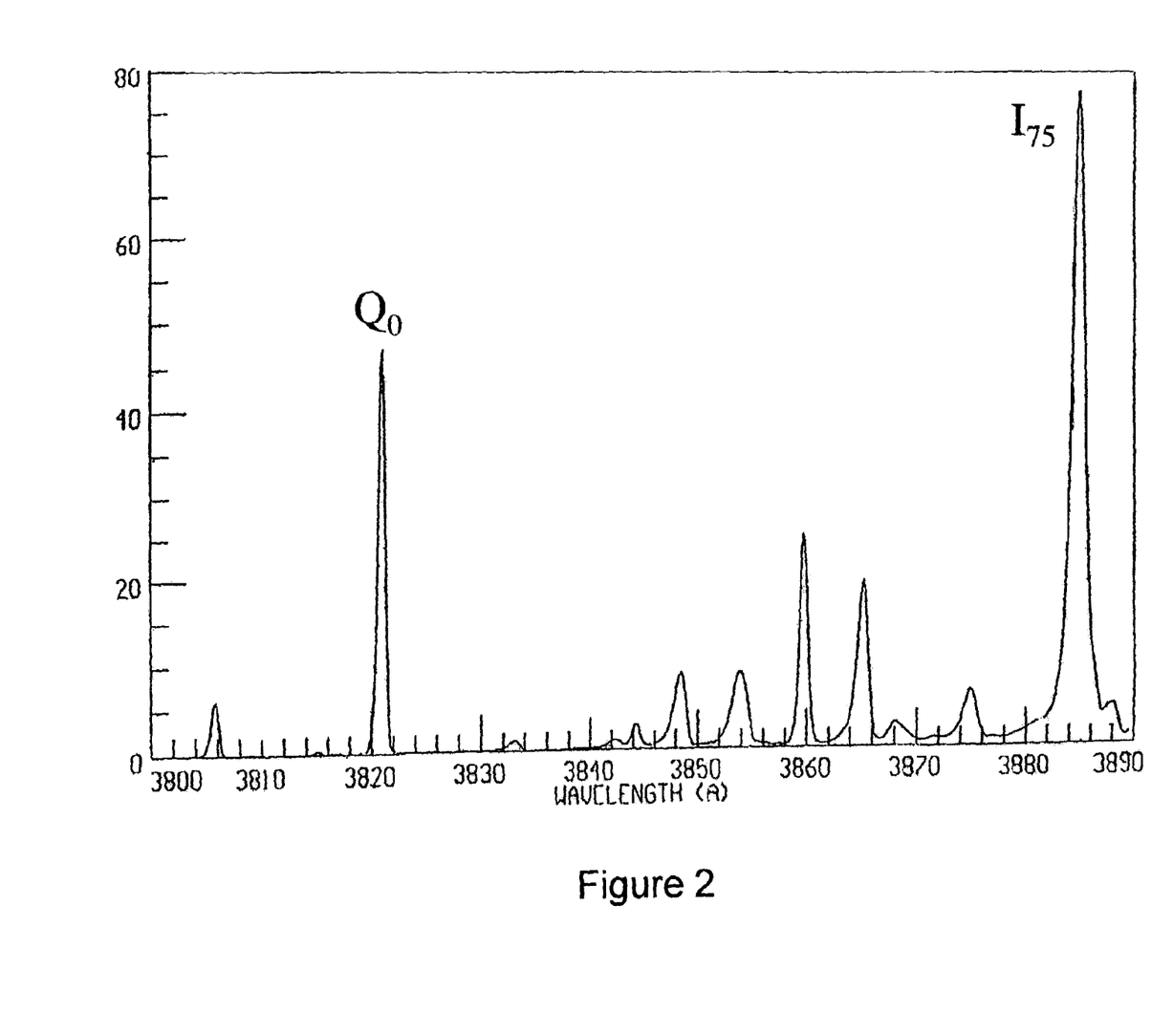
FIG. 2 shows the low temperature photoluminescence spectrum corresponding to a 4H-silicon carbide crystal grown in a hydrogen ambient according to the invention herein.

FIGS. 1 and 2 illustrate that the invention described and claimed herein presents a significant advancement in the field of growing highly pure, semi-insulating silicon carbide crystals by sublimation. The hydrogen ambient controls the nitrogen incorporated into the crystal and provides a more reliable semi-insulating silicon carbide crystal quality. FIG. 1 shows the low temperature photoluminescence spectrum corresponding to a 4H-silicon carbide crystal grown in a conventional argon ambient. FIG. 2 shows the low temperature photoluminescence spectrum corresponding to a 4H-silicon carbide crystal grown in a hydrogen ambient according to the invention herein.

A background discussion is helpful in understanding the advantages illustrated by FIGS. 1 and 2. The figures plot the photoluminescence spectra for silicon carbide crystals and show luminescent intensity peaks at specific wavelengths. These peaks of luminescence are proportionally related to the nitrogen content of the silicon carbide crystal under consideration. See Ivanov et al., Nitrogen Doping Concentration as determined by Photoluminescence in 4H— and 6H—SiC, Journal of Applied Physics, vol. 80, no. 6, Sep. 15, 1996, pp. 3504–3508. The nitrogen concentration in a crystal can be determined by the luminescence of electrons and holes during their recombination at neutral nitrogen centers.

In the study of electron-hole recombinations, silicon carbide is known as an indirect bandgap semiconductor. As known to those familiar with electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the crystal.

The indirect band gap of silicon carbide prevents the direct recombination of holes and electrons. The direct non-phonon assisted recombination of a free exciton, independent of other particles, is therefore forbidden. The recombination of electrons and holes in silicon carbide requires the formation of the previously discussed phonon to account for the difference in momentum between recombined electrons and holes.

Ivanov et al. reported in 1996 that the electron-hole exciton may be coupled to a phonon or bound to an impurity in the crystal to account for the required conservation of momentum. The luminescence intensity of the recombination is dependent upon whether the recombined electron-hole pair is bound to a phonon or to an impurity, such as nitrogen. See Ivanov et al., supra., pp. 3504–3508. Ivanov et al., therefore, show that the concentration of impurity in a crystal can be determined by comparing the luminescence intensity of an electron-hole recombination paired with an impurity and the luminescence intensity of an electron-hole recombination paired with a phonon.

FIGS. 1 and 2 herein illustrate these concepts and show the success of the nitrogen reduction method of the present invention. The figures plot the relative luminescence intensity versus wavelength for 4H silicon carbide crystals. The peak luminescence intensity is shown as $Q_0$ and corresponds to the intensity of an electron-hole recombination bound to a nitrogen atom as an impurity in the crystal. Less intense peaks of luminescence in the figures correspond to phonon coupled recombinations, the most significant of which for purposes herein is the recombination marked $I_{75}$. $I_{75}$ is the highest intensity phonon-assisted recombination and can be identified by its asymmetric line shape (Ivanov, supra at 3505). As known to those in the art, the ratio of $Q_0$ to $I_{75}$ yields a constant that can be used to extrapolate the nitrogen content of the subject silicon carbide crystal (Ivanov, supra at 3508).

Considering FIG. 1, the luminescence intensity is plotted for a 4H silicon carbide crystal grown by sublimation in a traditional argon ambient atmosphere. FIG. 1 is, therefore, indicative of prior art in the area of silicon carbide grown by sublimation. The extrapolated nitrogen content is approximately $3\times10^{15}$ nitrogen atoms per cubic centimeter of the resulting silicon carbide crystal.

FIG. 2 shows the luminescence data corresponding to a crystal grown in a hydrogen ambient atmosphere by the invention disclosed herein. As can be seen in the spectrum, the ratio of $Q_0$ to $I_{75}$ is at 0.6, corresponding to a nitrogen concentration in the crystal of $3\times10^{14}$ nitrogen atoms per cubic centimeter. The data of FIG. 2 shows that the presence of a hydrogen ambient in the sublimation growth chamber reduced the nitrogen content in the crystal by approximately one order of magnitude. FIG. 2 shows, therefore, that the hydrogen concentration in the growth chamber ambient can be used to reduce the nitrogen content of the resulting silicon carbide crystal grown therein. The resulting low nitrogen crystal is a high purity semi-insulating crystal as desired.

In the specification, there have been disclosed typical embodiments of the invention, and, although specific terms have been employed, they have been used in a generic and descriptive sense only and not for purposes of limitation, the scope of the invention being set forth in the following claims.

The invention claimed is:

1. A method of producing semi-insulating silicon carbide crystal by heating and maintaining a silicon carbide source powder to sublimation in a growth chamber, while heating and maintaining a silicon carbide seed crystal in the growth chamber to a second temperature below the temperature of the source powder, at which second temperature sublimed species from the source powder condense upon the seed crystal to continuously grow a silicon carbide crystal while maintaining the source powder and the seed crystal during sublimation growth at respective temperatures high enough to increase the number of point defects in the growing crystal to an amount that renders the resulting silicon carbide crystal semi-insulating, the method comprising maintaining an ambient concentration of hydrogen in the growth chamber sufficient to minimize the amount of nitrogen incorporated into the silicon carbide crystal.

2. A method of producing semi-insulating silicon carbide crystal with a controlled nitrogen content the method comprising:

heating and maintaining a silicon carbide source powder to sublimation while, heating and maintaining a silicon carbide seed crystal to a temperature below the temperature of the source powder, at which temperature sublimed species from the source powder condense upon the seed crystal to form a continuously expanding growth surface of silicon carbide crystal;

passivating the silicon carbide growth surface with hydrogen atoms to reduce the incorporation of nitrogen from the ambient atmosphere into a resulting silicon carbide crystal, heating the crystal to increase the number of point defects in the crystal to an amount that renders the resulting silicon carbide crystal semi-insulating.

3. A method according to claim 2 wherein the step of heating the crystal to increase the number of point defects comprises maintaining the source powder and the seed crystal during sublimation growth at respective temperatures high enough to increase the number of point defects in the growing crystal to an amount that renders the resulting silicon carbide crystal semi-insulating.

4. A method according to claim 2 wherein the step of heating the crystal to increase the number of point defects comprises heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

5. A method according to claim 2 comprising passivating the growth surface with hydrogen atoms by heating the source crystal and the seed crystal in a hydrogen ambient atmosphere.

6. A method according to claim 2 comprising passivating the growth surface with hydrogen atoms by adding hydrogen to the ambient atmosphere at a pressure of between about 0.1 and 50 Torr.

7. A method according to claim 2 comprising passivating the growth surface with hydrogen atoms by adding hydrogen to the ambient atmosphere at a flow rate of between about 10 and 1000 standard cubic centimeters per minute.

8. A method according to claim 2 comprising maintaining the silicon carbide source at a temperature of between about 2000° C. and 2500° C. and maintaining the seed crystal at a temperature that is between about 50° C. and 350° C. lower than the temperature of the source powder.

9. A method according to claim 2 comprising heating a seed crystal having a polytype selected from the group consisting of 3C, 4H, 6H, and 15R polytype of silicon carbide.

10. A method according to claim 2 comprising heating to sublimation a silicon carbide source powder in which the amounts of deep level trapping elements in the source powder are below the levels that can be detected by secondary ion mass spectroscopy (SIMS).

11. A method according to claim 2 comprising introducing a sufficient amount of ambient hydrogen into the growth chamber to yield a growing silicon carbide crystal with less than about $2\times10^{15}$ nitrogen atoms per cubic centimeter.

12. A method according to claim 2 comprising introducing a sufficient amount of ambient hydrogen into the growth chamber to yield a growing silicon carbide crystal with less than about $1\times10^{15}$ nitrogen atoms per cubic centimeter.

13. A semi-insulating silicon carbide crystal produced by the method of claim 2 having a concentration of nitrogen atoms less than about $2\times10^{15}$ cm$^{-3}$.

14. A semi-insulating silicon carbide crystal produced by the method of claim 2 having a concentration of nitrogen atoms less than about $1\times10^{15}$ cm$^{-3}$.

15. A semi-insulating silicon carbide crystal produced by the method of claim 2 having a resistivity of at least $1\times10^5$ ohm-cm.

16. A method of producing a semi-insulating silicon carbide crystal with a controlled nitrogen content, the method comprising:
  introducing an ambient gas containing hydrogen into a sublimation growth chamber;
  heating a silicon carbide source powder to sublimation in the hydrogen ambient growth chamber while,
  heating and then maintaining a silicon carbide seed crystal in the hydrogen ambient growth chamber to a second temperature below the temperature of the source powder, at which second temperature sublimed species from the source powder will condense upon the seed crystal,
  continuing to heat the silicon carbide source powder until a desired amount of silicon carbide crystal growth has occurred upon the seed crystal;
  while maintaining an ambient concentration of hydrogen in the growth chamber sufficient to minimize the amount of nitrogen incorporated into the growing silicon carbide crystal; and
  heating the crystal to increase the number of point defects in the crystal to an amount that renders the resulting silicon carbide crystal semi-insulating.

17. A method according to claim 16 wherein the step of heating the crystal to increase the number of point defects comprises maintaining the source powder and the seed crystal during sublimation growth at respective temperatures high enough to increase the number of point defects in the growing crystal to an amount that renders the resulting silicon carbide crystal semi-insulating.

18. A method according to claim 16 wherein the step of heating the crystal to increase the number of point defects comprises heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

19. A method according to claim 16 comprising introducing the ambient hydrogen into the growth chamber at a pressure between about 0.1 and 50 Torr.

20. A method according to claim 16 comprising introducing the ambient hydrogen into the growth chamber at a flow rate of between about 10 and 1000 standard cubic centimeters per minute.

21. A method according to claim 16 comprising heating a seed crystal having a polytype selected front the group consisting of 3C, 4H, 6H, and 15R polytype of silicon carbide.

22. A method according to claim 16 comprising maintaining the silicon carbide source powder at a temperature of between about 2000° C. and 2500° C. and maintaining the seed crystal at a temperature that is between about 50° C. and 350° C. lower than the temperature of the source powder.

23. A method according to claim 16 comprising heating a silicon carbide source powder in which the amounts of deep level trapping elements in the source powder are below the levels that can be detected by secondary ion mass spectroscopy (SIMS).

24. A method according to claim 16 comprising introducing a sufficient amount of ambient hydrogen into the growth chamber to yield a growing silicon carbide crystal with less than about $2\times10^{15}$ nitrogen atoms per cubic centimeter.

25. A method according to claim 16 comprising introducing a sufficient amount of ambient hydrogen into the growth chamber to yield a growing silicon carbide crystal with less than about $1\times10^{15}$ nitrogen atoms per cubic centimeter.

26. A method according to claim 16 comprising introducing a hydrocarbon species into the growth chamber to establish the hydrogen ambient.

27. A semi-insulating silicon carbide crystal produced by the method of claim 16 having a concentration of nitrogen atoms less than about $2\times10^{15}$ cm$^{-3}$.

28. A semi-insulating silicon carbide crystal produced by the method of claim 16 having a concentration of nitrogen atoms less than about $1\times10^{15}$ cm$^{-3}$.

29. A send-insulating silicon carbide crystal produced by the method of claim 16 having a resistivity of at least $1\times10^5$ ohm-cm.

30. A method of producing a semi-insulating silicon carbide crystal with a controlled nitrogen content, the method comprising:
  introducing an ambient gas containing hydrogen into a sublimation growth chamber;
  heating a silicon carbide source powder to sublimation in the hydrogen ambient growth chamber while,
  heating and then maintaining a silicon carbide seed crystal in the hydrogen ambient growth chamber to a second temperature below the temperature of the source powder, at which second temperature sublimed species from the source powder will condense upon the seed crystal,
  continuing to heat the silicon carbide source powder until a desired amount of silicon carbide crystal growth has occurred upon the seed crystal;
  while maintaining an ambient concentration of hydrogen in the growth chamber sufficient to passivate the growing silicon carbide crystal against the incorporation of nitrogen to thereby minimize the amount of nitrogen incorporated into the growing silicon carbide crystal; and
  heating the crystal to increase the number of point defects in the crystal to an amount that renders the resulting silicon carbide crystal semi-insulating.

31. A method according to claim 30 wherein the step of heating the crystal to increase the number of point defects comprises maintaining the source powder and the seed crystal during sublimation growth at respective temperatures high enough to increase the number of point defects in the growing crystal to an amount that renders the resulting silicon carbide crystal semi-insulating.

32. A method according to claim 30 wherein the step of heating the crystal to increase the number of point defects comprises heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

33. A method according to claim 30 comprising introducing the ambient hydrogen into the growth chamber at a pressure of between about 0.1 and 50 Torr.

34. A method according to claim 30 comprising introducing the ambient hydrogen into the growth chamber at a flow rate of between about 10 and 1000 standard cubic centimeters per minute.

35. A method according to claim 30 comprising maintaining the silicon carbide source powder at a temperature of between about 2000° C. and 2500° C. and maintaining the seed crystal at a temperature that is between about 50° C. and 350° C. lower than the temperature of the source powder.

36. A method according to claim 30 comprising heating a seed crystal having a polytype selected from the group consisting of 3C, 4H, 6H, and 15K polytype of silicon carbide.

37. A method according to claim 30 comprising heating a silicon carbide source powder in which the amounts of deep level trapping elements in the source powder are below the levels that can be detected by secondary ion mass spectroscopy (SIMS).

38. A method according to claim 30 comprising introducing a sufficient amount of ambient hydrogen into the growth chamber to yield a growing silicon carbide crystal with less than about $2 \times 10^{15}$ nitrogen atoms per cubic centimeter.

39. A method according to claim 30 comprising introducing a sufficient amount of ambient hydrogen into the growth chamber to yield a growing silicon carbide crystal with less than about $1 \times 10^{15}$ nitrogen atoms per cubic centimeter.

40. A semi-insulating silicon carbide crystal produced by the method of claim 28 having a concentration of nitrogen atoms less than about $2 \times 10^{15}$ cm$^{-3}$.

41. A semi-insulating silicon carbide crystal produced by the method of claim 30 having a concentration of nitrogen atoms less than about $1 \times 10^{15}$ cm$^{-3}$.

42. A semi-insulating silicon carbide crystal produced by the method of claim 30 having a resistivity of at least $1 \times 10^{5}$ ohm-cm.

* * * * *

UNITED STATES PATENT AND TRADEMARK OFFICE
CERTIFICATE OF CORRECTION

| | | |
|---|---|---|
| PATENT NO. | : 7,147,715 B2 | |
| APPLICATION NO. | : 10/628189 | |
| DATED | : December 12, 2006 | |
| INVENTOR(S) | : David Phillip Malta et al. | |

It is certified that error appears in the above-identified patent and that said Letters Patent is hereby corrected as shown below:

Title Page
In the title page under OTHER PUBLICATIONS:

Please add: --J.R. JENNY, ST. G. MULLER, A. POWELL, V.F. TSVETKOV, H.MCD. HOBGOOD, R.C. GLASS, & C.H.CARTER; High Purity Semi-Insulating 4H-SiC Grown by the Seeded Sublimation Method; Preprint-2001 Electronic Materials Conference-submitted to Journal of Electronic Materials, U.S.A--

In the SPECIFICATION

1.   Column 6, line 24, delete "modem" an insert therefor -- "modern" --

In the CLAIMS

1. Column 12, line 6, delete "front" and insert therefor -- "from" --
2. Column 12, line 37, delete "send-insulating" and insert therefor -- "semi-insulating" --
3. Column 14, line 6, delete "15K" and insert therefor -- "15R" --

Signed and Sealed this

Twentieth Day of February, 2007

JON W. DUDAS
*Director of the United States Patent and Trademark Office*